(12) United States Patent
Mitchell et al.

(10) Patent No.: US 6,850,062 B2
(45) Date of Patent: Feb. 1, 2005

(54) LOCAL MULTI-SCALE FOURIER ANALYSIS FOR MRI

(75) Inventors: J. Ross Mitchell, Calgary (CA); T. Chen Fong, Calgary (CA); Hongmei Zhu, Calgary (CA); Bradley G. Goodyear, Calgary (CA); Robert Brown, Spirit River (CA)

(73) Assignee: 976076 Alberta Inc., Calgary (CA)

( * ) Notice: Subject to any disclaimer, the term of this patent is extended or adjusted under 35 U.S.C. 154(b) by 0 days.

(21) Appl. No.: 10/430,295

(22) Filed: May 7, 2003

(65) Prior Publication Data

US 2003/0210045 A1 Nov. 13, 2003

Related U.S. Application Data

(60) Provisional application No. 60/378,963, filed on May 10, 2002.

(51) Int. Cl.⁷ .................................................. G01V 3/00
(52) U.S. Cl. ....................................................... 324/307
(58) Field of Search ................................ 324/307–309, 324/300, 312–314, 318, 322; 600/410; 702/1; 382/276, 280, 281

(56) References Cited

U.S. PATENT DOCUMENTS

| | | | | |
|---|---|---|---|---|
| 5,291,891 A | * | 3/1994 | Foo et al. | 600/410 |
| 5,973,496 A | * | 10/1999 | Chandrakumar et al. | 324/322 |
| 6,181,135 B1 | * | 1/2001 | Shen | 324/309 |
| 6,611,701 B2 | * | 8/2003 | Foo | 600/413 |
| 2003/0210047 A1 | * | 11/2003 | Mitchell et al. | 324/309 |
| 2003/0212490 A1 | * | 11/2003 | Mitchell et al. | 702/1 |
| 2003/0212491 A1 | * | 11/2003 | Mitchell et al. | 702/1 |

OTHER PUBLICATIONS

Lee, I.W.C. et al.; "An S–transform based neural pattern classifier for non–stationary signals"; Signal Processing, 2002 6th International Conference on, vol.: 2, Aug. 26–30, 2002, pp.:1047–1050 vol. 2.*

(List continued on next page.)

Primary Examiner—Diego Gutierrez
Assistant Examiner—Dixomara Vargas
(74) Attorney, Agent, or Firm—Freedman & Associates

(57) ABSTRACT

The present invention relates to a method for processing magnetic resonance signal data. magnetic resonance signal data in dependence upon a magnetic resonance signal time series are received. The magnetic resonance signal data are then transformed into a time-frequency Stockwell domain using a localizing time window having a frequency dependent window width in order to provide multi-resolution in the time-frequency domain. The Stockwell transformed magnetic resonance signal data are then processed in the Stockwell domain, for example, filtered based on time-frequency information of the Stockwell transformed magnetic resonance signal data. The processed Stockwell transformed magnetic resonance signal data are then transformed into Fourier domain by summing the Stockwell transformed magnetic resonance signal data over time indices of the Stockwell domain. In a further step the Fourier transformed magnetic resonance signal data are then transformed into time domain using inverse Fourier transformation. In another embodiment the method for processing magnetic resonance signals is extended for processing two-dimensional magnetic resonance signal image data in a space-frequency Stockwell domain. The method for processing magnetic resonance signals according to the invention using the Stockwell transform overcomes many limitations of the Fourier framework of existing magnetic resonance signal processing tools. It is highly advantageous by providing frequency and time/space information while keeping a close connection with the Fourier formalism, which allows implementation of the method according to the present invention into existing Fourier-based signal processing tools.

38 Claims, 15 Drawing Sheets

OTHER PUBLICATIONS

Brown, R.A. et al.; "Distributed vector processing of the S-transform for medical applications", Electrical and Computer Engineering, 2002. IEEE CCECE 2002. Canadian Conference on , vol.: 2, May 12–15, 2002, pp.: 1129–1133 vol. 2.*

Bradley G. Goodyear et al., "Removal of phase artifacts from fMRI data using a Stockwell transform filter improves brain activit detection Magnetic Resonance in Medicine", vol. 51, Issue 1, Date: Jan. 2004, pp.: 16–21.*

C. Robert Pinnegar et al., "Application of the S transform to prestack noise attenuation filtering" Journal of Geophysical Research vol. 108, No. B9, 2422, doi:10.1029/2002JB002258, 2003.*

Varanini, M. et al.; "Spectral analysis of cardiovascular time series by the S-transform"; Computers in Cardiology 1997, Sep. 7–10, 1997, pp.:383–386.*

Livanos, G et al.; "Heart sound analysis using the S transform", Computers in Cardiology 2000, Sep. 24–27, 2000 pp.:587–590.*

Adams, M.D.et al.; "Generalized S transform", Acoustics, Speech, and Signal Processing, 2001. Proceedings. (ICASSP '01). 2001 IEEE International Conference on , vol.: 3, May 7–11, 2001, pp.:1749–1752 vol. 3.*

Adams, M.D.et al.; "Generalized S transform", Signal Processing, IEEE Transactions on [see also Acoustics, Speech, and Signal Processing, IEEE Tranactions on], vol.: 50 , Issue: 11 , Nov. 2002, pp.:2831–2842.*

L.Mansinha et al., "Pattern analysis with two dimensional spectral localization: Applications of 2 Dimensional S-Transforms", Physica A, 239, pp286—295, 1997.*

C. Robert Pinnegar and Lalu Mansinha, "The S-transform with windows of arbitrary and varying shape", Geophysics, vol. 68, No. 1 (Jan.–Feb. 2003); P. 381–385, 5 FIGS. 10.1190/1.1543223.*

C. Robert Pinnegar and Lalu Mansinha, "The Bi–Gaussian S-Transform" SIAM J.S. CI.C OMPUT (Society for Industrial and Applied Mathematics) vol. 24,No. 5,pp. 1678–1692 2003.*

C. Robert Pinnegar and Lalu Mansinha, "Time–local Spectral Analysis for Non–Stationary Time Series: The S-Transform for Noisy Signals", Fluctuation and Noise Letters vol. 3, No. 3 (2003) L357 L364 World Scientific Publishing Company.*

Mansinha et al., "Local S-spectrum Analysis of 1-D and 2-D Data", Physics of the Earth and Planetary Interiors, Elsevier Science B.V., No. 103, pp. 329–336, 1997.

Stockwell et al., "Localization of the Complex Spectrum: The S Transform", IEEE Transactions on Signal Processing, IEEE, vol. 44, No. 4, Apr. 1996.

* cited by examiner

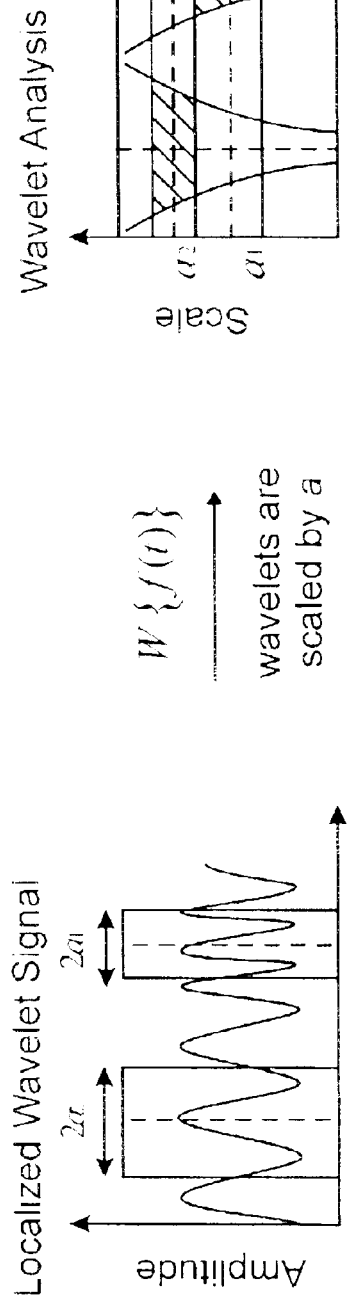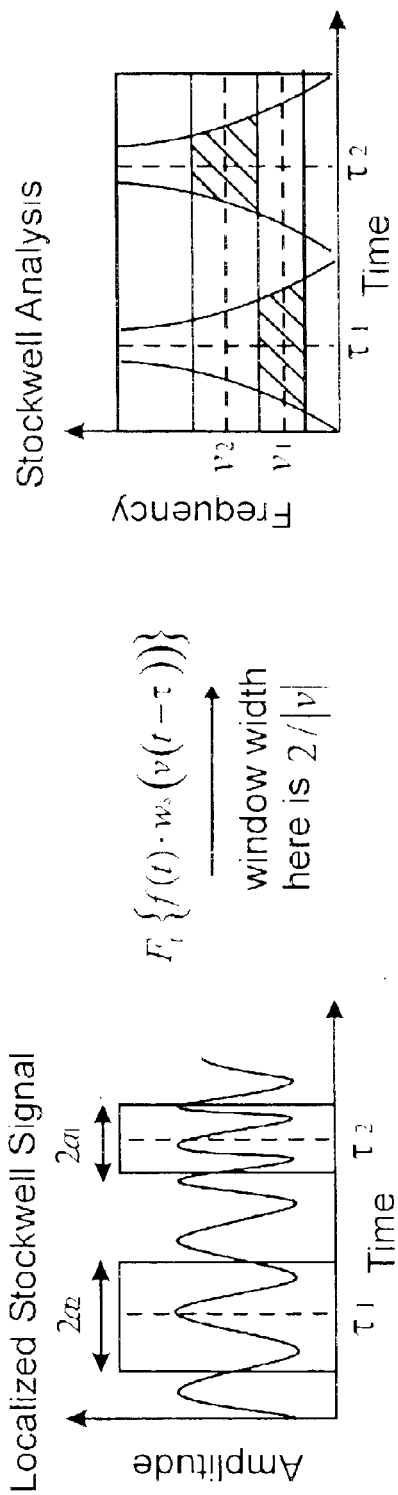
Fig. 1c
Fig. 1d

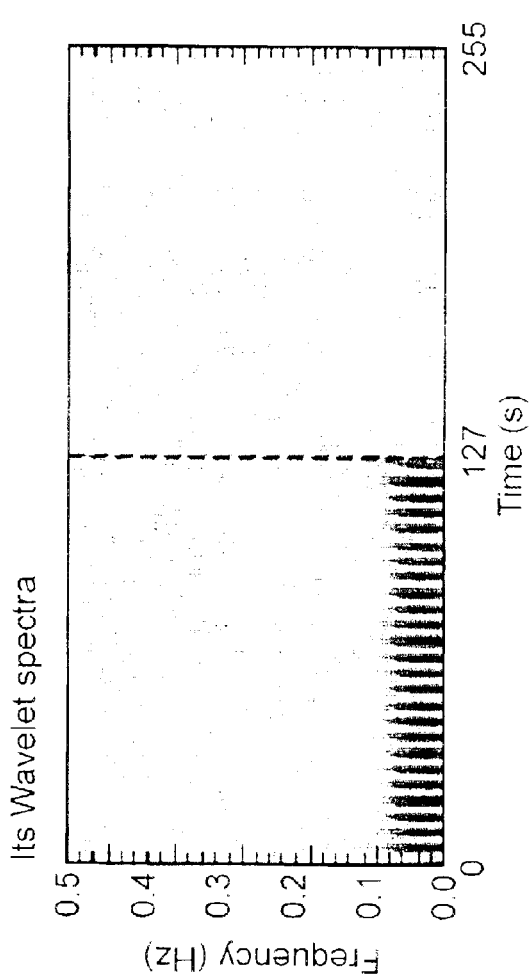

receiving magnetic resonance signal data, the magnetic resonance signal data being in dependence upon a magnetic resonance signal time series transforming the magnetic resonance signal data into a time-frequency Stockwell domain using a localizing time window having a frequency dependent window width in order to provide multi-resolution in the time-frequency domain determining regions in the time-frequency Stockwell domain containing frequency components associated with signal disturbances zero-filling the determined regions in the time-frequency Stockwell domain transforming the processed magnetic resonance signal data into Fourier domain by summing the Stockwell transformed magnetic resonance signal data over time indices of the Stockwell domain transforming the magnetic resonance signal data into time domain using inverse Fourier transformation

Fig. 5 receiving the two-dimensional magnetic resonance signal data

↓ transforming the two-dimensional magnetic resonance signal data into a space-frequency Stockwell domain based on two one-dimensional Stockwell transformations, one transformation for each coordinate direction, using a localized space window in each direction, the localized space windows having a frequency dependent window width

↓ filtering based on space-frequency information of the Stockwell transformed two-dimensional magnetic resonance signal data

↓ transforming the Stockwell transformed two-dimensional magnetic resonance signal data into Fourier domain by summing the Stockwell transformed two-dimensional magnetic resonance signal data over space indices of the Stockwell domain

↓ displaying an image of a physical characteristic of the object based on the Stockwell transformed two-dimensional magnetic resonance signal data

Fig. 7c

LOCAL MULTI-SCALE FOURIER ANALYSIS FOR MRI

This application claims benefit from U.S. Provisional Application No. 60/378,963 filed May 10, 2002.

FIELD OF THE INVENTION

This invention relates to magnetic resonance imaging systems and in particular to a new signal processing method based on local multi-scale Fourier analysis in order to reveal frequency variations in a measured signal over time or space.

BACKGROUND OF THE INVENTION

Magnetic resonance imaging (MRI) provides a powerful tool for non-invasive imaging for treatment assessment and for minimally invasive surgery. The contrast sensitivity of the MRI provides a capability of non-invasively revealing structures and functions of internal tissues and organs not known to other imaging techniques such as, for example, CT scan or Ultrasound.

In MRI data collection and image reconstruction are directly based on Fourier theory. Therefore, the Fourier Transform (FT) forms the basis of the MRI. The underlying Fourier technique is based on the assumption that the sensed signals forming a collected Fourier space—the so-called k-space—contain no temporal changes in spatial frequencies. However, in reality, limitations of equipment, subject motion, respiratory and cardiac activity, blood flow, peristalsis and other physiological fluctuations cause temporal changes in spatial frequencies. In fact, the signals sampled in k-space are actually a subset of (k, t)-space, where t refers to time. Thus, the Fourier technique in MRI actually folds time information with spatial frequency information leading to image distortion and artifacts, which substantially reduce image quality.

Mathematically, the Fourier transform analyzes an entire signal and decomposes the signal into sinusoids of different frequencies. The Fourier transform provides information regarding frequency events within the entire signal. However, the Fourier transform does not provide information regarding the instance of occurrence of a particular frequency component, possibly resulting in the loss of crucial information during signal analysis and processing.

To overcome the deficiency of the FT, other techniques such as the Gabor transform (GT) disclosed in: Gabor, D. "Theory of communications", J. Inst. Elec. Eng., 1946; 93, 429–457, also known as the short time Fourier transform, and the Wavelet transform (WT) disclosed in: Goupillaud P., Grossmann, A., Morlet J. "Cycle-octave and related transforms in seismic signal analysis", Geoexplor, 1984; 23, 85–102, and in: Grossmann, A., Morlet J. "Decomposition of Hardy functions into square integrable Wavelets of constant shape", SIAM J. Math. Anal., 1984; 15, 723–736, have been developed. Both of these methods unfold the time information by localizing the signal in time and calculating its "instantaneous frequencies." However, both the GT and the WT have limitation substantially reducing their usefulness in the analysis of magnetic resonance signals. The GT has a constant resolution over the entire time-frequency domain which limits the detection of relatively small frequency changes. The WT has variant resolutions, but it provides time versus scale information as opposed to time versus frequency information. Although "scale" is loosely related to "frequency"—low scale corresponds to high frequency and high scale to low frequency—for most wavelets there is no explicit relationship between scale factors and the Fourier frequencies. Therefore, the time-scale representation of a signal is difficult if not impossible to interpret.

It would be advantageous to combine the time-frequency representation of the GT with the multi-scaling feature of the WT in order to overcome the above drawbacks and to provide both time and frequency information by adapting the FT to analyze a localized magnetic resonance signal using frequency dependent time-scaling windows.

SUMMARY OF THE INVENTION

It is, therefore, an object of the invention to provide a new multi-scale FT signal processing method for processing MR signal data using frequency dependent time-scaling windows.

It is further an object of the invention to substantially improve image quality by removing image distortions and artifacts using the new multi-scale FT signal processing method.

It is yet further an object of the invention to provide a new multi-scale FT signal processing method such that the same is easily implemented in the FT framework of an existing MRI system.

The method for processing MR signals according to the invention using the Stockwell transform overcomes many limitations of the Fourier framework of existing MR signal processing tools. It is highly advantageous by providing frequency and time/space information while keeping a close connection with the Fourier formalism, which allows implementation of the method according to the present invention into existing Fourier-based signal processing tools.

In accordance with the present invention there is provided a method for processing magnetic resonance signal data comprising the steps of:

sensing a magnetic resonance signal received from an object and providing magnetic resonance signal data in dependence thereupon;

transforming the magnetic resonance signal data into second magnetic resonance signal data within a Stockwell domain using frequency dependent scaling windows; and, processing the second magnetic resonance signal data within the Stockwell domain to extract features therefrom.

In accordance with the present invention there is further provided a method for processing magnetic resonance signal data comprising the steps of:

receiving the magnetic resonance signal data, the magnetic resonance signal data being indicative of a magnetic resonance signal received from an object;

transforming the magnetic resonance signal data into second magnetic resonance signal data within a Stockwell domain using frequency dependent scaling windows; and, processing the second magnetic resonance signal data within the Stockwell domain to extract features relating to a physical occurrence within the object therefrom.

In accordance with the present invention there is further provided a method for processing time varying signal data comprising the steps of:

receiving the time varying signal data, the time varying signal data being indicative of a physical characteristic sensed from an object;

transforming the time varying signal data into second signal data within a Stockwell domain using frequency dependent scaling windows; and, processing the time varying signal data within the Stockwell domain to extract features relating to a physical occurrence within the object therefrom.

In accordance with the present invention there is further provided a method for processing time varying signal data comprising the steps of: sensing a time varying signal indicative of a physical characteristic of an object;

receiving time varying signal data in dependence upon the sensed time varying signal;

transforming the time varying signal data into second signal data within a Stockwell domain using frequency dependent scaling windows to determine transformed time varying signal data.

In accordance with the present invention there is yet further provided a method for processing magnetic resonance signal data comprising the steps of:

receiving the magnetic resonance signal data, the magnetic resonance signal data being indicative of a magnetic resonance signal received from an object;

transforming the magnetic resonance signal data into second magnetic resonance signal data within a Stockwell domain using frequency dependent scaling windows; and, displaying an image of a physical characteristic of the object based on the second magnetic resonance signal data.

In accordance with the present invention there is yet further provided a method for processing multi-dimensional imaging signal data comprising the steps of:

receiving the multi-dimensional imaging signal data, the multi-dimensional imaging signal data being indicative of a physical characteristic sensed from a patient;

transforming the multi-dimensional imaging signal data into second multi-dimensional imaging signal data within a Stockwell domain using frequency dependent scaling windows; and, displaying information indicative of the physical characteristic of the patient based on the second multi-dimensional imaging signal data.

BRIEF DESCRIPTION OF THE FIGURES

Exemplary embodiments of the invention will now be described in conjunction with the following drawings, in which:

FIGS. 1a to 1d are schematically illustrating the concepts of the Fourier, Gabor, Wavelet, and Stockwell transforms, respectively;

FIGS. 2b to 2e are diagrams of spectra corresponding to the signal shown in FIG. 2a obtained by the Fourier transform—FIG. 2b, the Gabor transform—FIG. 2c, the Wavelet transform—FIG. 2d, and the Stockwell transform—FIG. 2e, respectively;

FIG. 5 is a simplified flow diagram of a method for filtering MR signal data according to the invention;

DETAILED DESCRIPTION OF THE INVENTION

Figure 1A:
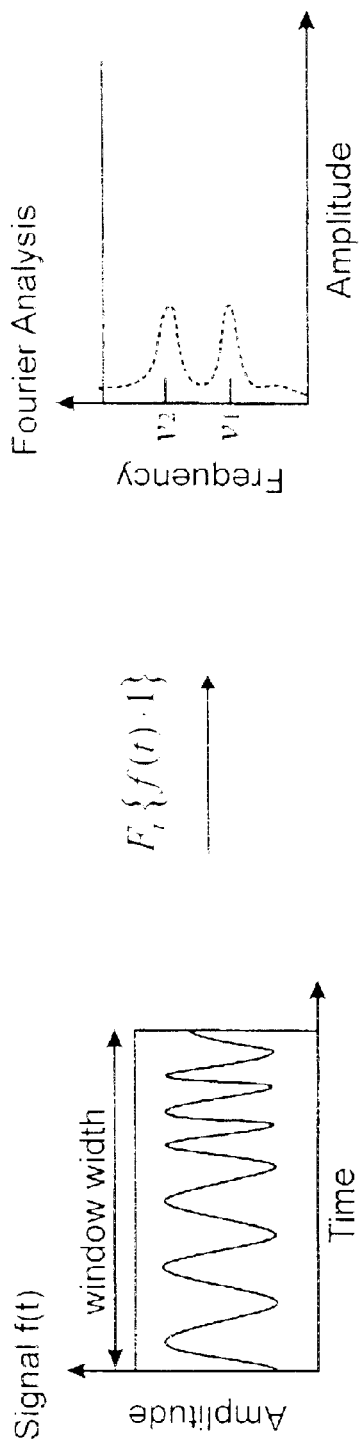

The method for processing magnetic resonance signal data according to the invention provides multi-scale FT signal processing using frequency dependent scaling windows. The method is based on the Stockwell Transform (ST). The ST has been recently introduced in geophysics and is disclosed in: Stockwell R. G., Mansinha L., Lowe R. P., "Localization of the complex spectrum: the S-transform", IEEE Trans. Signal Process, 1996; 44, 998–1000, and in: Mansinha L., Stockwell R. G., Lowe R. P., Eramian M., Schincariol R. A., "Local S-spectrum analysis of 1-D and 2-D data", Phys. Earth Plan. Interiors, 1997; 103, 329–336.

Hereinbelow, the theory of the ST and its application for analyzing magnetic resonance signal data is presented in one-dimensional form for simplicity. It is evident to those of skill in the art based on the explanation below that the method for processing magnetic resonance signal data according to the invention is not limited thereto but is also applicable for the processing of 2D and 3D magnetic resonance signal data as well as time series thereof.

Furthermore, in the following it will become apparent to those of skill in the art that the methods for signal processing according to the invention disclosed hereinbelow are not limited to processing of magnetic resonance signal data only but are applicable for processing of a wide range of time varying as well as multi-dimensional non time varying signals. For example, employment of the methods according to the invention is also highly beneficial in analyzing signal data captured by ultra-sound imaging, X-ray imaging, or electrocardiograms. Yet further applications include, for example, analysis of time varying seismic signal data, time varying environmental data, video data, acoustic signals for speech recognition, or music data, to mention a few.

The ST combines advantages of the time-frequency representation of the GT with the multi-scaling feature of the WT. It provides both time and frequency information by adapting the FT to analyze a localized signal using frequency-dependent time-scaling windows. These characteristics enable the signal processing based on the ST to detect subtle changes of the Fourier spectrum in time. Furthermore, the Fourier and Stockwell domains are readily converted from one to the other without loss of information. The ST is based on the GT and WT and has been developed to overcome their disadvantages. In order to provide a better understanding of the ST the concepts and drawbacks of the GT and the WT are explained next.

As previously mentioned, the FT decomposes magnetic resonance signal data into sinusoids that are not localized in time. Therefore, the FT is not capable to analyze non-stationary signals whose frequencies vary over time. In order to capture temporal changes in frequencies, the GT localizes the signal data with a time window function resulting in a FT that analyzes a small portion of the signal data at a time. The GT of a signal f(t), denoted as $G(\tau,v)$, is given by $$G(\tau, v) \equiv G\{f(t)\} = \quad [1]$$
$$\int_{-\infty}^{+\infty} f(t) W_G^*\left(\frac{t-\tau}{b}\right) \exp(-2\pi i t v) dt = F_t\left\{f(t) \cdot W_G\left(\frac{t-\tau}{b}\right)\right\},$$

where $F_t$ denotes the Fourier operator over time t, v is the corresponding Fourier frequency variable, and τ represents translation of the window along the time axis. The function $$W_G^*\left(\frac{t-\tau}{b}\right)$$

is the complex conjugate of a time-localizing window $$W_G\left(\frac{t-\tau}{b}\right)$$

having a width being proportional to a pre-determined constant b, centered at time t=τ. For example, the window function is chosen to be a Gaussian function, namely $$W_G\left(\frac{t-\tau}{b}\right) = \frac{1}{\sqrt{2\pi b^2}} \exp\left(-\frac{(t-\tau)^2}{2b^2}\right), \quad [2]$$

where the window width is 2b—full width at half maximum (FWHM). Note that in the case of $W_G(t)=1$ for all t the GT is reduced to the FT. The result of the GT is a function of both time and frequency. It provides information about which frequencies occur and when. However, the resolution is controlled by the window width parameter b, which is constant in the GT. Therefore, the entire time and frequency resolution is fixed. This is a major drawback of the GT because two frequency components are likely not distinguishable in the time-frequency domain if their occurrences are within one window width.

This drawback is overcome by the WT having variant resolution. The WT of a signal f(t) is defined as follows:

$$W(\tau, a) = W\{f(t)\} = \frac{1}{\sqrt{|a|}} \int_{-\infty}^{+\infty} f(t) m *\left(\frac{t-\tau}{a}\right) dt, \quad [3]$$

where the function m(t), the so-called "mother wavelet", is scaled according to the scaling factor a. Unlike the FT which uses sinusoids as basis functions, the WT uses more general basis functions, i.e. wavelets, which are scaled and translated versions of the mother wavelet. Therefore, the WT determines "similarities" between the signal and the wavelets. This determination is performed at varying scales—the time analysis window becomes narrower at lower scales, i.e. as a gets smaller. Thus, time resolution is better at low scales allowing for more easily distinguishing between two very close bursts. Therefore, the multi-scale analysis provides for a more accurate assessment of local signal characteristics such as discontinuities and self-similarity. However, the wavelet spectra are associated with the scaling factors, which are only loosely related to the Fourier frequencies, i.e. low scale corresponds to high frequency and high scale corresponds to low frequency, and for most wavelets there is no explicit relationship between the scale factors and the Fourier frequencies. Therefore, the time-scale representation of a magnetic resonance signal is difficult if not impossible to interpret.

The ST combines the local Fourier analysis of the GT with the multi-scale feature of the WT. The one-dimensional ST (1D-ST) of a time series f(t), denoted as S(τ,v), is expressed as:

$$S(\tau, v) \equiv S\{f(t)\} = \quad [4]$$
$$\int_{+\infty}^{-\infty} f(t) W_S\left(\frac{t-\tau}{\frac{1}{|v|}}\right) \exp(-2\pi i t v) dt = F_t\{f(t) \cdot W_S(|v|(t-\tau))\}.$$

The localizing time window $W_S$ is, for example, a Gaussian function having a frequency dependent window width:

$$W_S(|v|(t-\tau)) = \frac{|v|}{\sqrt{2\pi}} \exp\left(-\frac{(t-\tau)^2 v^2}{2}\right). \quad [5]$$

Comparing equation [1] with equation [4] shows that the GT and the ST are almost identical except for the width of the GT time local window becoming $$\frac{1}{|v|}$$

in the ST, i.e. the window width in the ST is scaled by a function that is inversely proportional to the temporal frequency. As a result, narrower windows are used at higher frequencies and wider windows at lower frequencies providing multiple resolutions for analyzing a signal, similar to the varying window width of the WT. The result of the ST is provided in the time-frequency Stockwell domain as opposed to the time-scale representation of the WT. Therefore, it is possible to consider the ST as a local FT with a multi-scaled localizing time window.

Figure 1B:
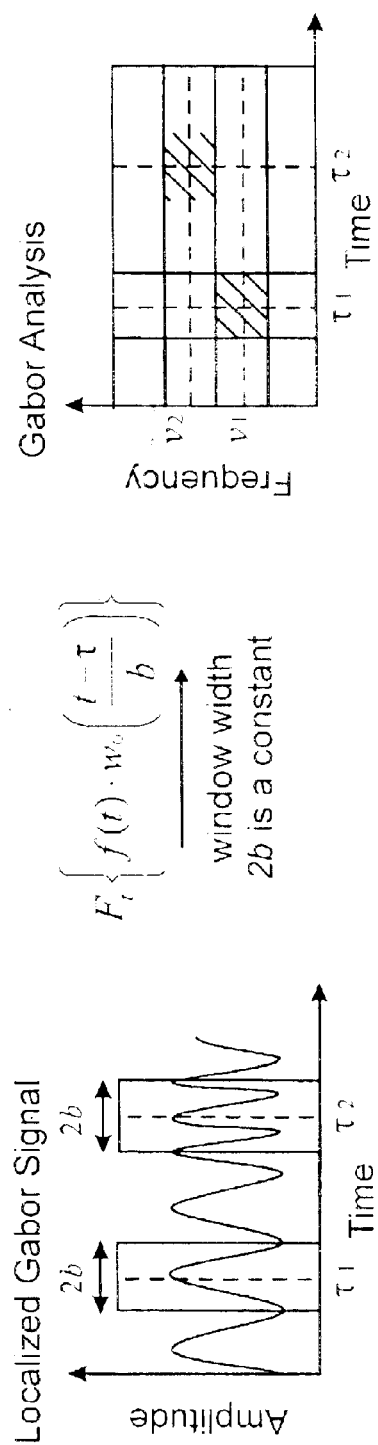

Referring to FIGS. 1a to 1d, the transformation of a signal f(t) into the various domains of the transforms discussed above is shown, i.e. the frequency domain of the FT in FIG. 1a, the time-frequency domain of the GT in FIG. 1b, the time-scale domain of the WT in FIG. 1c, and the time-frequency domain of the ST in FIG. 1d. As shown in FIG. 1d the ST provides a direct time-frequency description of the signal behavior with flexible temporal/frequency resolution as indicated by the shaded areas at time instances $\tau_1$ and $\tau_2$.

As is evident to those of skill in the art, it is possible to choose from numerous different window functions for use in the ST. However, for any window function better time resolution leads to poorer frequency resolution and vice versa. This fact is based on Heisenberg's uncertainty principle:

$$\Delta t \cdot \Delta v \geq \frac{1}{4\pi}, \quad [6]$$

where Δt and Δv denote the time and frequency resolutions, respectively. Due to this inequality, it is impossible to simultaneously achieve arbitrarily good time and frequency resolutions, i.e. arbitrarily small values for Δt and Δv. The product Δt·Δv is always bounded below and reaches its minimum $$\frac{1}{4\pi}$$

when a Gaussian window is chosen. In this case, relative optimal resolutions in both time and frequency are achieved.

The ST has numerous advantages over the FT, GT, and WT in analyses of magnetic resonance signals. The FT provides only frequency content and is, therefore, not effective in analyzing non-stationary magnetic resonance signals. The ST provides both frequency content and its temporal variation. This type of time-frequency analysis provides information of when and what frequency events occur, allowing a better analysis of magnetic resonance signals whose frequency varies over time.

Furthermore, the ST adjusts the window width adaptively to frequencies and produces multi-resolution in the time-frequency domain. According to the uncertainty principle, wide time windows provide better frequency resolution. As a result, the ST provides higher frequency resolution at low frequencies. This facilitates the identification of low frequency components that usually represent structural identities of a magnetic resonance signal, for example, the stimulation and respiration rates when processing a magnetic resonance signal. Conversely, narrow time windows at high frequencies provide good temporal resolution allowing a more accurate detection of the occurrence of subtle high frequency changes. High frequency events often contain distinct detailed features in a magnetic resonance signal, for example, sudden motion or other temporally limited frequency events. Therefore, the multi-resolution characteristic of the ST is highly advantageous for processing and analysis of magnetic resonance signals by enabling more precise assessment of magnetic resonance signal behaviors.

Figure 2A:
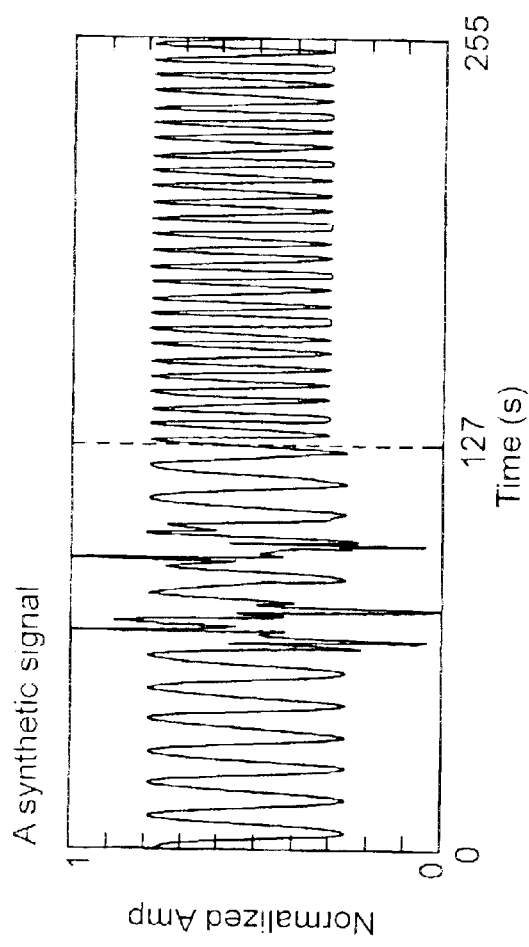
FIG. 2a is a diagram of a synthetic time-varying signal.
Figure 2B:
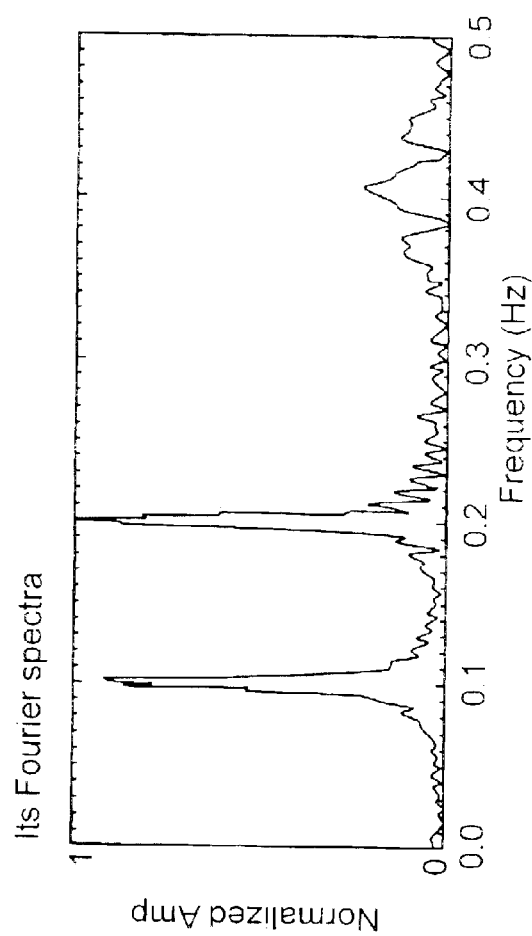
Figure 2E:
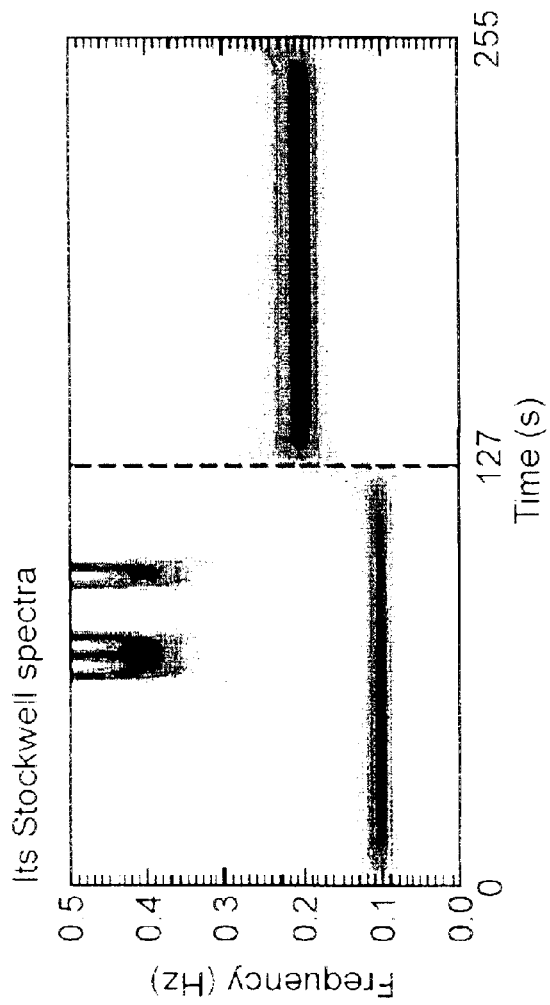

The main characteristics of the ST discussed above will now be illustrated in the following example. Referring to FIG. 2a a synthetic signal consisting of four components—two constant frequency sinusoids and two short bursts of high frequency sinusoids occurring within a short period of time—is shown. The FT, FIG. 2b, shows which frequencies took place, but not when. The GT, FIG. 2c, provides information on which frequencies happen and when, but it doesn't clearly separate the two high frequency bursts due to the fixed window width yielding a constant resolution. The WT, FIG. 2d, provides the time versus scale information which does not allow any assessment of the signal behavior. The ST, FIG. 2e, clearly shows when the frequencies occur, and also clearly distinguishes the frequency content and temporal location of the two high frequency bursts. The components at frequencies v=0.2 and 0.4 Hz are more stretched along the frequency axis than that at v=0.1 Hz. This is because at high frequencies analysis windows are narrower along the time direction but wider along frequency, which yields a better time resolution but a poorer frequency resolution due to the uncertainty principle—equation [6]. Similarly, the uncertainty principle is the cause for the component at v=0.1 Hz extending into the second half of the Stockwell temporal domain—this component occurred exactly for the first 128 seconds.

Another important characteristic of the ST is its close relation to the FT. Using the Fourier convolution theorem, equation [4] is rewritten as:

$$S(\tau, v) = F_t\{f\} \otimes F_t\{W_S\} = \int_{-\infty}^{+\infty} F(u+v)\exp\left(-\frac{2\pi^2 u^2}{v^2}\right)\exp(2\pi i \tau u)du \quad [7]$$

for v≠0, where ⊗ denotes convolution over frequency v, and F(u) is the Fourier spectrum of f (t). At zero frequency v=0, the ST is defined as the average of the signal f(t). Equation [7] is obtained using the Fourier translation, scaling properties and simple algebra. Implementing equation [7] not only reduces calculation time by using the computationally efficient FFT, but also allows direct computation of the ST using the Fourier data produced in existing magnetic resonance systems.

Conversely, the Stockwell domain is converted into the Fourier domain using $$F(v) = \int_{-\infty}^{+\infty} S(\tau, v)d\tau, \quad [8]$$

i.e. summing over the time indices in the Stockwell domain returns the Fourier domain, as follows from equations [4] and [5] and the fact that the Stockwell window function satisfies $$\int_{-\infty}^{+\infty} W_S(v(t-\tau))d\tau = \frac{|v|}{\sqrt{2\pi}} \int_{-\infty}^{+\infty} \exp\left(-\frac{(t-\tau)^2 v^2}{2}\right) d\tau = 1. \quad [9]$$

Figure 3A:
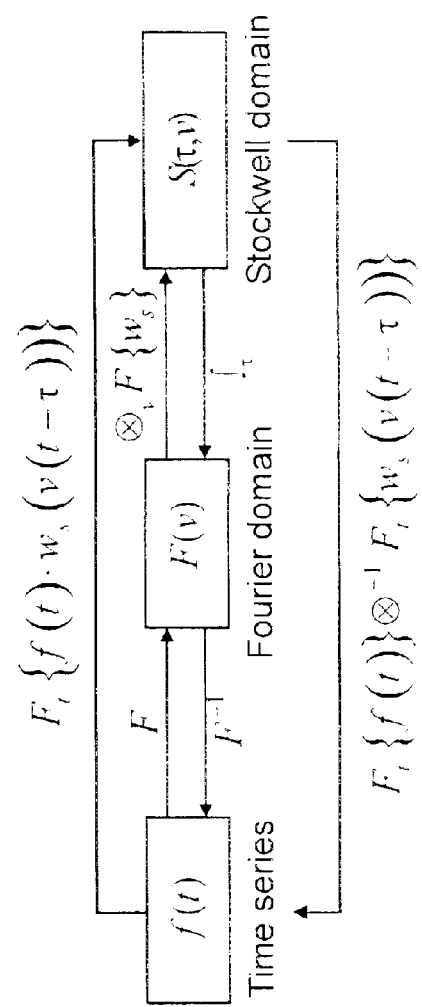
FIG. 3a is a simplified diagram illustrating the conversion between the Fourier transformation and the Stockwell transformation.
Figure 3B:
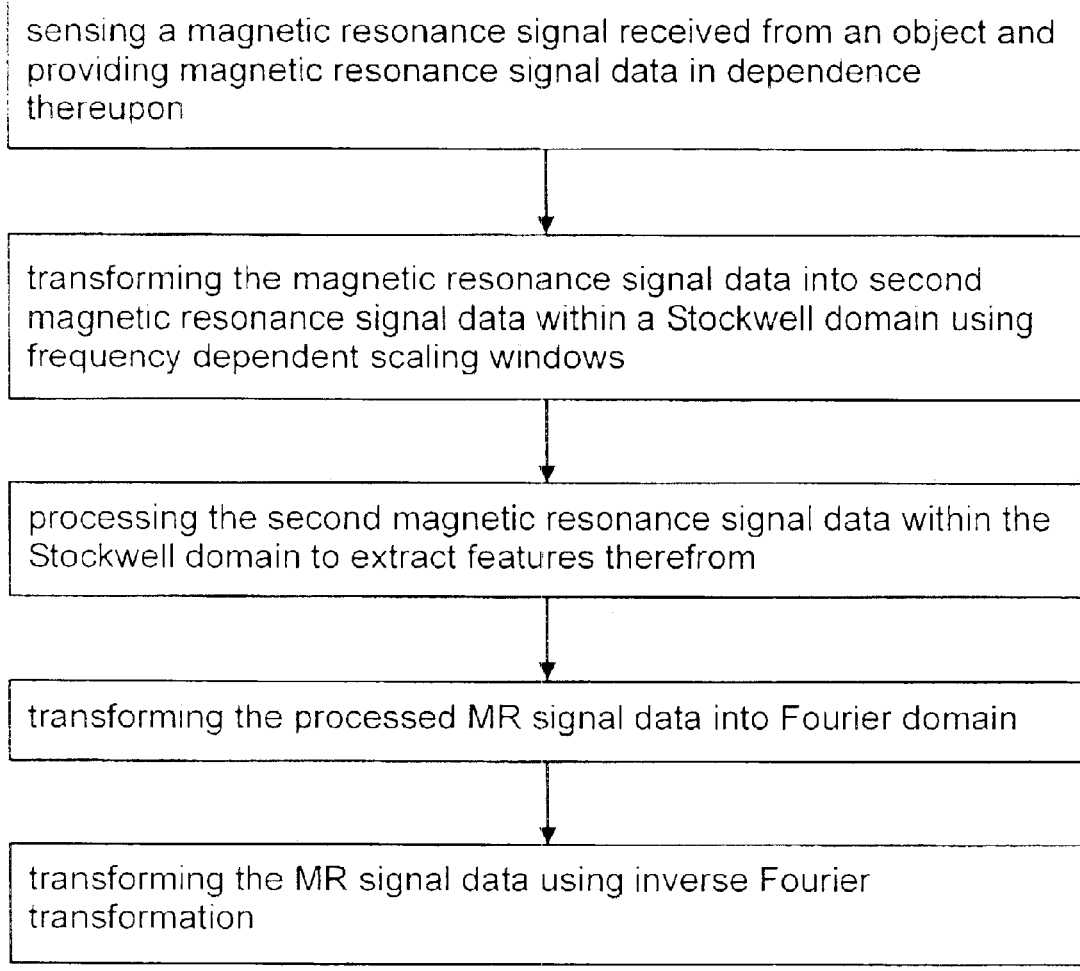
FIGS. 3b to 3e are simplified flow diagrams of various embodiments of a method for processing MR signal data according to the invention.
Figure 3C:
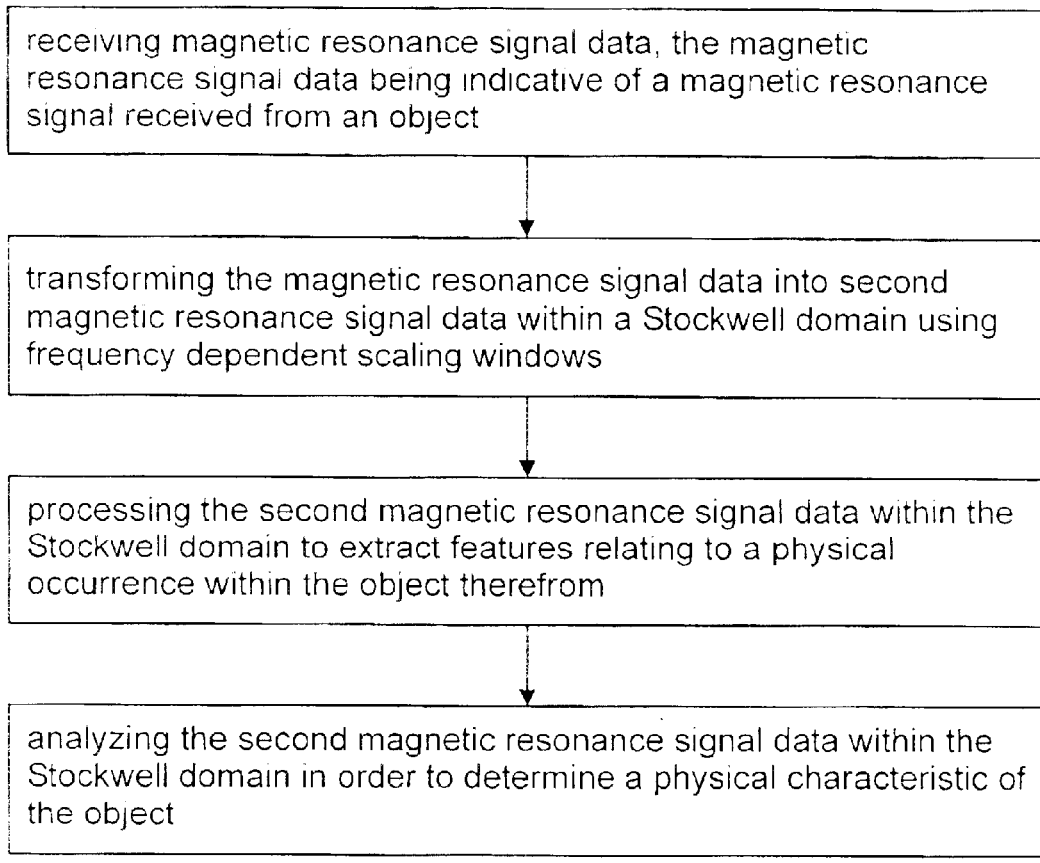
Figure 3D:
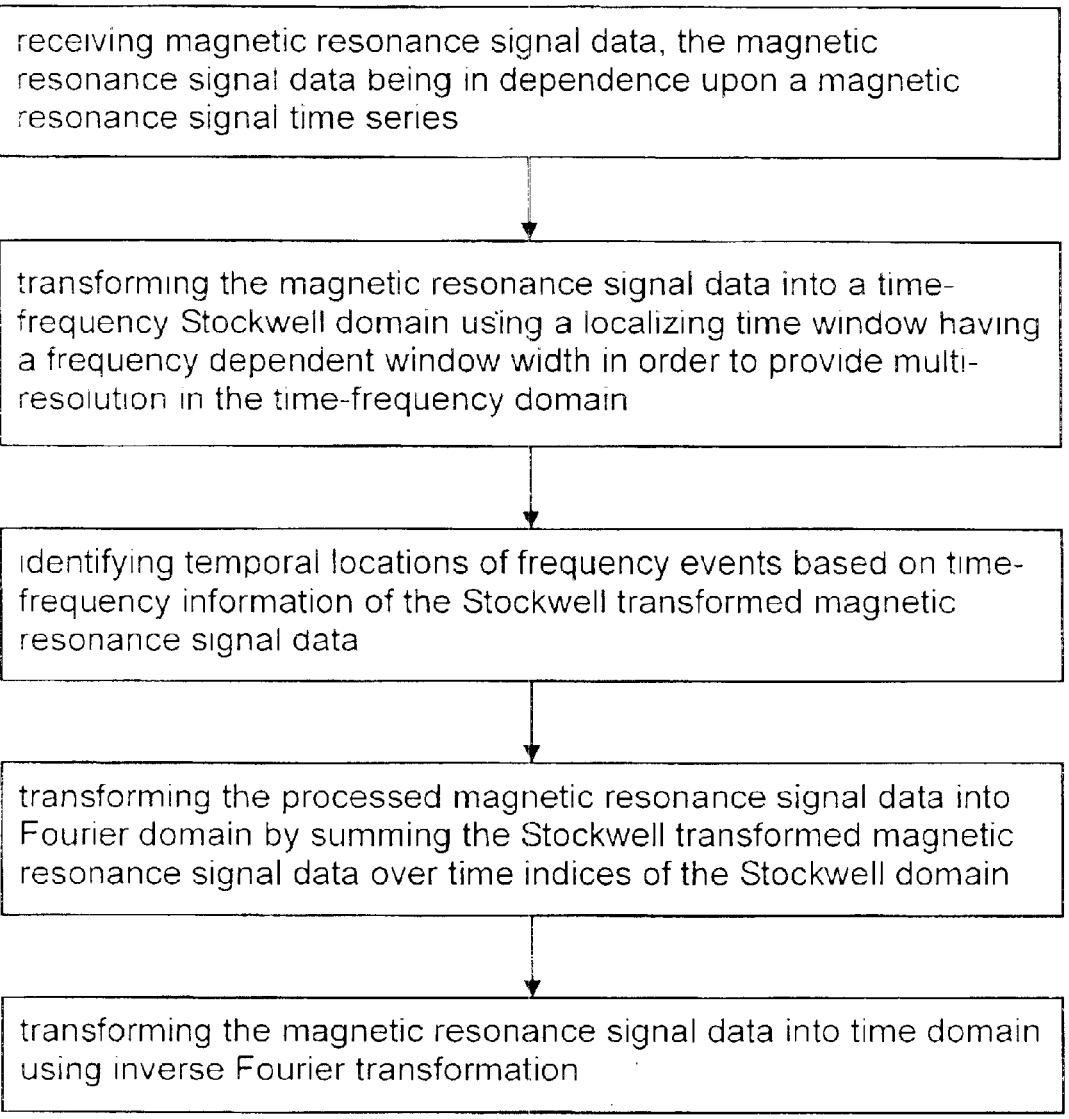
Figure 3E:
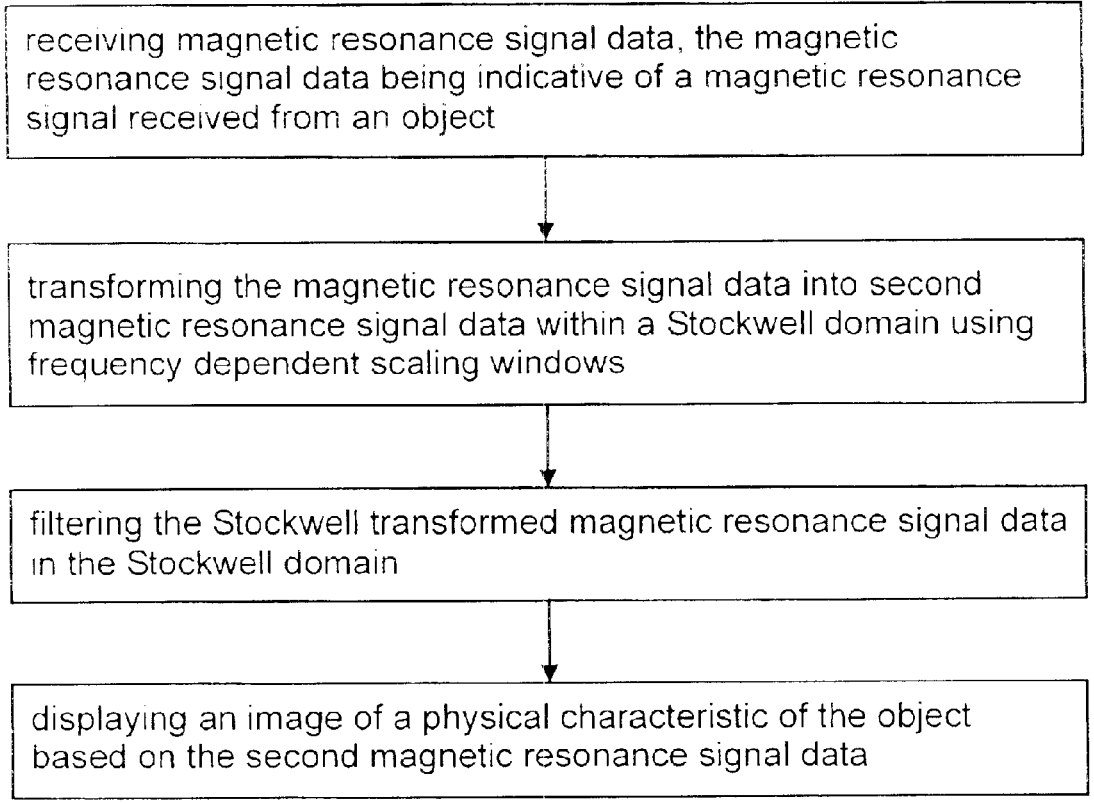

Equations [7] and [8] indicate the possibility of converting the Stockwell and Fourier domains from one to the other without loss of information as shown in FIG. 3a and provide the basis for the method for processing magnetic resonance signal data according to the invention, shown in FIGS. 3b to 3e. This close relation also provides the possibility of implementing the method for processing magnetic resonance signal data based on the ST into existing magnetic resonance systems by extending the well-established Fourier signal processing methods in the existing magnetic resonance systems to the new Stockwell signal processing method. Table 1 summarizes the properties of each transform clearly indicating the advantageous features of the ST.

TABLE 1

|    | Frequency | Time | Multi-Resolution | To/From the Fourier Domain |
|----|-----------|------|------------------|----------------------------|
| FT | YES       | NO   | NO               | N/A                        |
| GT | YES       | YES  | NO               | YES                        |
| WT | NO        | YES  | YES              | NOT DEFINITE               |
| ST | YES       | YES  | YES              | YES                        |

Figure 4:
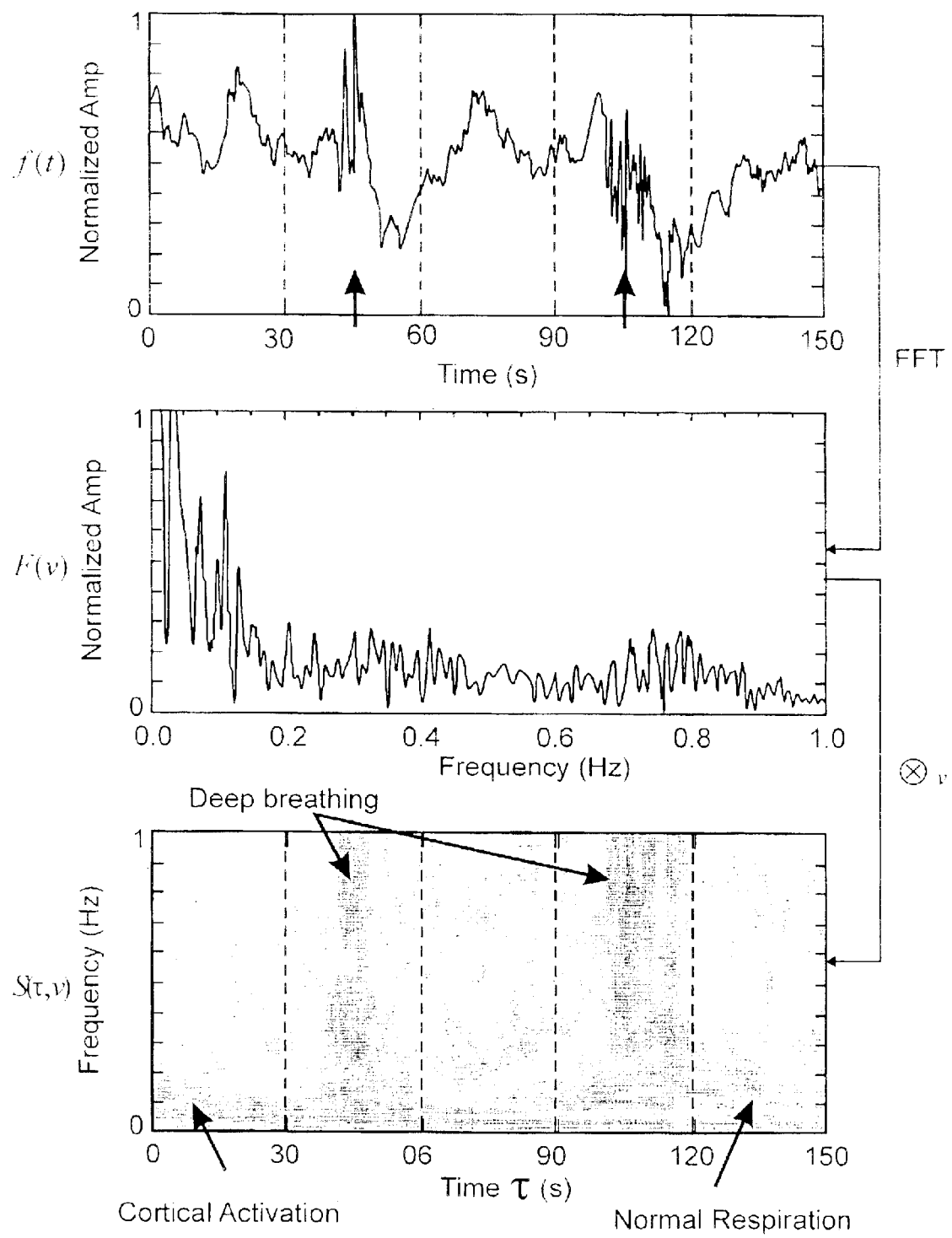
FIG. 4 illustrates the Fourier and the Stockwell transforms of experimental data from a flashing checkerboard visual stimulation MR experiment using the method for processing MR signal data according to the invention.

Referring to FIG. 4, signal processing of a magnetic resonance signal f(t) using the method for processing magnetic resonance signal data according to the invention is illustrated. The magnetic resonance signal f(t), shown in the top diagram, is first transformed into the Fourier domain using FFT resulting in the Fourier Transform F(v), shown in the second diagram from top. In the following step the Fourier Transform F(v) as then transformed into the Stockwell domain using the Fourier convolution theorem resulting in the Stockwell Transform S(σ,v), shown in the third diagram from top. The magnetic resonance time series f(t) was obtained from a flashing checkerboard visual stimulation experiment. $T_2^*$-weighted images (64×64, FOV=24 cm, TE/TR=30/500 ms) have been collected from a healthy volunteer on a 3T scanner (GE, Waukesha, Wis.). The study included five 30 s cycles, each including 6 s of visual stimulation—activation phase—followed by 24 s of a blank gray screen with a central fixation point—rest phase. Within the second and fourth cycles the volunteer was asked to take several quick deep breaths. Image pixels exhibiting a significant increase in magnetic resonance signal above baseline were identified by correlating pixel intensity with an expected intensity time course derived by convolving the blocked stimulus pattern with an ideal hemodynainic response function as disclosed in: Birn R. M., Cox R. W. Bandettini P. A., "Detection versus estimation in event-related fMRI: choosing the optimal stimulus timing", NeuroImage 2002, 15, 252–264. Pixels surpassing a correlation coefficient of r=0.4 were considered as activated. The average time course of the activated pixels within he visual cortex was extracted for FT and ST analysis. In the example, no post-processin schemes were applied to correct for head motion or physiological fluctuations.

The average magnetic resonance time series f(t) described above is shown in the top diagram of FIG. 4. Note the high frequency artifacts induced in the signal as a result of quick deep breathing as well as the lower frequency signals following deep breathing resulting from short-term hyperventilation, as indicated by the arrows. The FT, illustrated in the second diagram from top, shows the stimulation rate and normal breathing events of the normal respiratory cycle, but not the quick deep breathing events because they spread over a wide frequency range. The ST, third diagram from top, shows the visual cortex stimulation and the normal breathing events throughout the entire experiment. Furthermore, it clearly reveals the occurrence of heavy breathing events in the second and fourth cycles—both high and low frequencies—demonstrating how unfolding time and frequency information with the multi-scaled analysis of the ST enables a medical practitioner to interpret magnetic resonance signals substantially more efficiently and to identify the temporal locations of frequency events more accurately.

Figure 6:
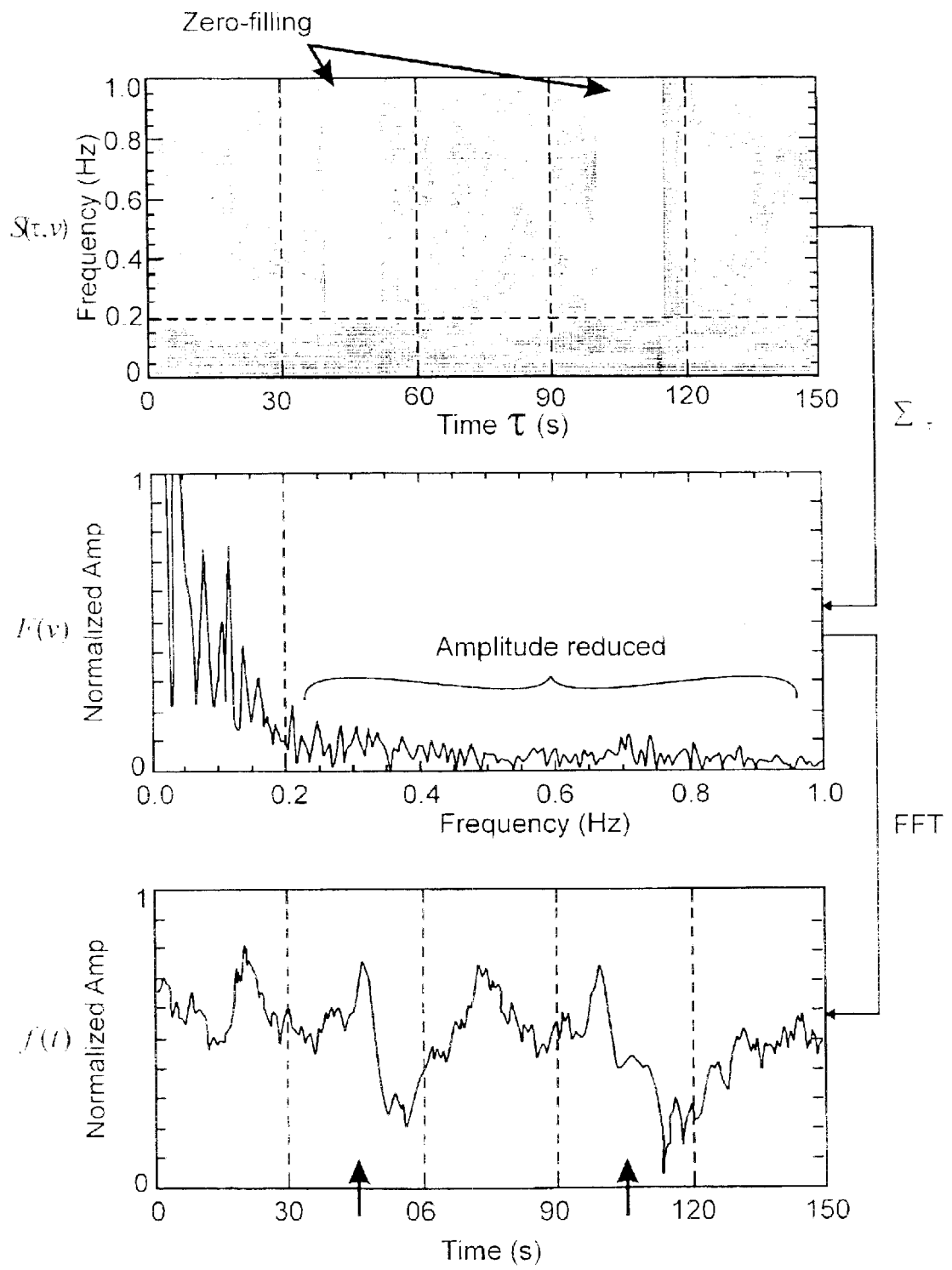
FIG. 6 illustrates the filtering of the experimental data shown in FIG. 4 in the Stockwell domain and the transformed signal after filtering using the method for filtering MR signal data according to the invention shown in FIG. 5; and, FIGS. 7a to 7c are simplified flow diagrams of various embodiments of a method for processing two-dimensional MR image signal data according to the invention.

As is evident the ST not only allows for improved signal interpretation but also provides new possibilities for signal processing such as generating feedback control signals and different and/or improved filtering methods. For example, FIG. 5 shows a schematic flow diagram of a method for local temporal filtering of magnetic resonance signal data in the Stockwell domain according to the invention. The effectiveness of the ST for local temporal filtering is illustrated in FIG. 6. In order to enhance the magnetic resonance time series, two rectangular regions in the Stockwell domain, which contain the high frequency spikes caused by quick deep breathing but do not overlap with the stimulation frequency component, have been determined. Then the determined two "deep breathing regions" are zero-filled as shown in the top diagram of FIG. 6. In the following step the signal is transformed into the Fourier domain by summing over the time indices as described in equation [9]. The removal of the high frequency spikes in the Stockwell domain modifies the FT spectrum accordingly, i.e. the amplitude at high frequencies is reduced as shown in the second diagram from the top in FIG. 6 when compared to the second diagram from top in FIG. 4, while the low frequency portion is exactly the same as that before the filtering. The filtered magnetic resonance time series, third diagram from top in FIG. 6 is then reconstructed using inverse FT or, preferably, inverse FFT. After local temporal filtering the high frequency deep breathing artifacts are substantially attenuated, while the lower frequency physiologically meaningful signal due to normal breathing is maintained. The signal outside the quick deep breathing regions is unaffected by this kind of filtering. As is evident to those of skill in the art, other than within the rectangular regions. Other methods of signal processing are applicable to the signal data in the Stockwell domain taking advantage of the capability to accurately localize events in time and frequency.

The signal processing in the Stockwell domain as shown in FIGS. 4 an 6 clearly illustrates the advantages of using the ST for processing magnetic resonance sign data by revealing temporal frequency variations. It substantially facilitates identification or localization of frequency components of interest and, therefore, substantially facilitates information extraction and signal analysis as well as increases accuracy of the signal analysis. Filtering the magnetic resonance signal data in the Stockwell domain effectively corrects quick deep breathing artifacts in magnetic resonance signals and is, of course, also applicable in general motion correction of magnetic resonance signals, as shown by the inventors in: Goodyear B. G., Zhu H., Frayne R., Mitchell J. R., "Filtering noise from fMRI data using the Stockwell transform", Proc. of the $10^{th}$ Annual Meeting of ISMRM Honolulu, Hi. 2002, pp. 1419.

Although the frequency adapted Gaussian window is ideal for optimal time and frequency resolution it is possible to modify the ST to improve either time or frequency resolution at the expense of the other. For example, Mansinha suggested in: Mansinha L., Stockwell R. G., Lowe R. P., Eramian M., Schincariol R. A., "Local S-spectrum analysis of 1-D and 2-D data", Phys. Earth Plan Interiors, 1997, 103, 329–336, show scaling the Gaussian time windows by $$\frac{a}{|v|},$$

where a>0 is a constant. If the parameter a>1 then frequency resolution is improved; otherwise temporal resolution is improved. Other techniques were developed to improve resolutions for various applications, such as asymmetric Gaussian windows disclosed by McFadden P. D. Cook J. G., and Forster L. M., "Decomposition of gear vibration signals by the generalized transform", Mechanical Systems and Signal Processing 1999; 13(5):691–707, and invertible generalized Stockwell transforms (linear combinations of the Stockwell spectra with different frequency scales) disclosed by Pinnegar C. R., "The generalized S-transform and TT-transform in one and two dimensions", Ph.D Theses. The University of Western Ontario, London, Canada, 2001 and Zhou Y., "Boundary Detection in Petrographic images and applications of S-transform space-wavenumber analysis to image processing for texture definition", Ph.D Theses, The University of Western Ontario, London, Canada, 2002. As it stands, the ST is useful for analyzing signals containing high frequency events with short duration and/or low frequency events with long duration. Fortunately, such signals are often encountered in MR experiments.

Figure 7A:
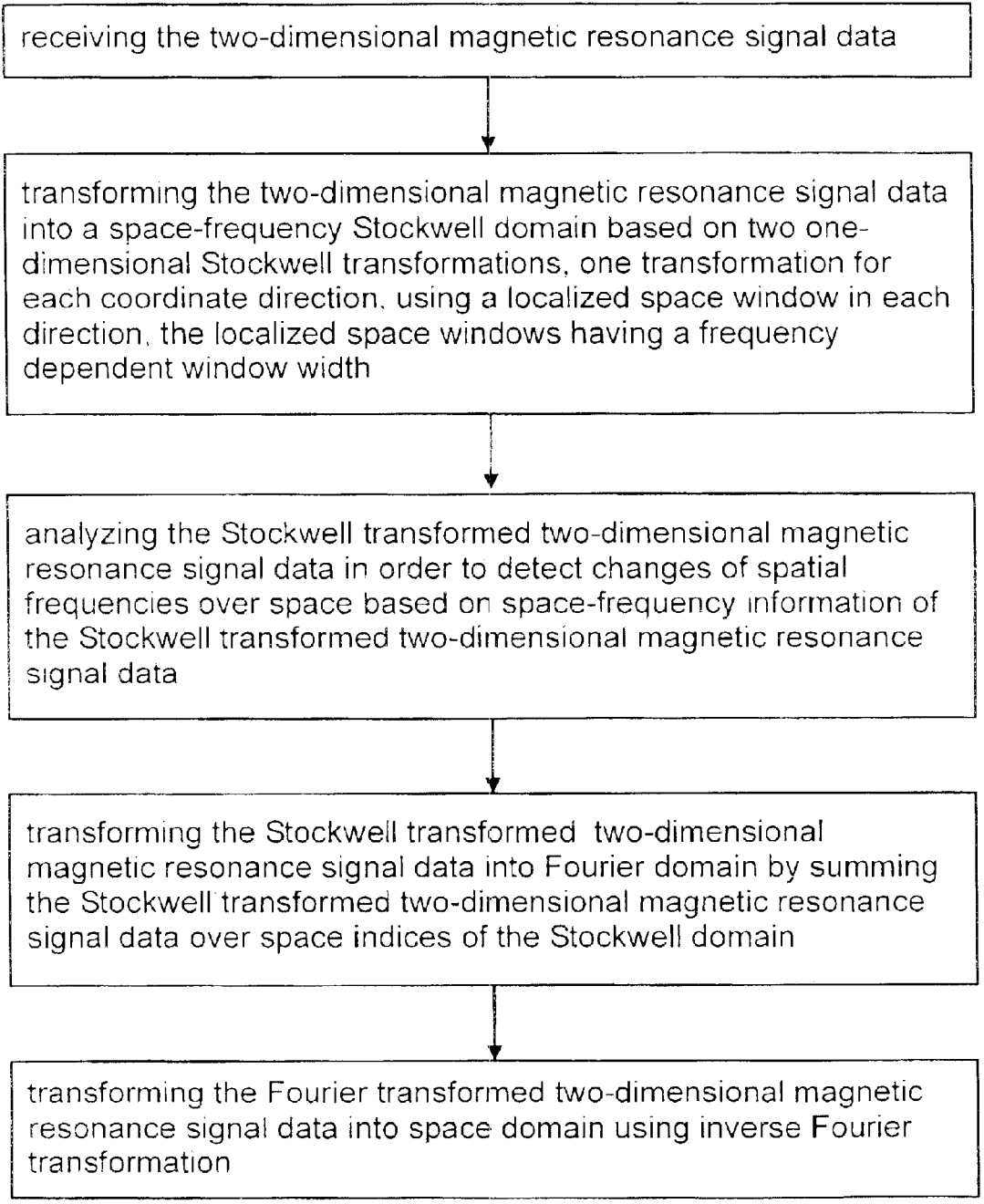
Figure 7B:
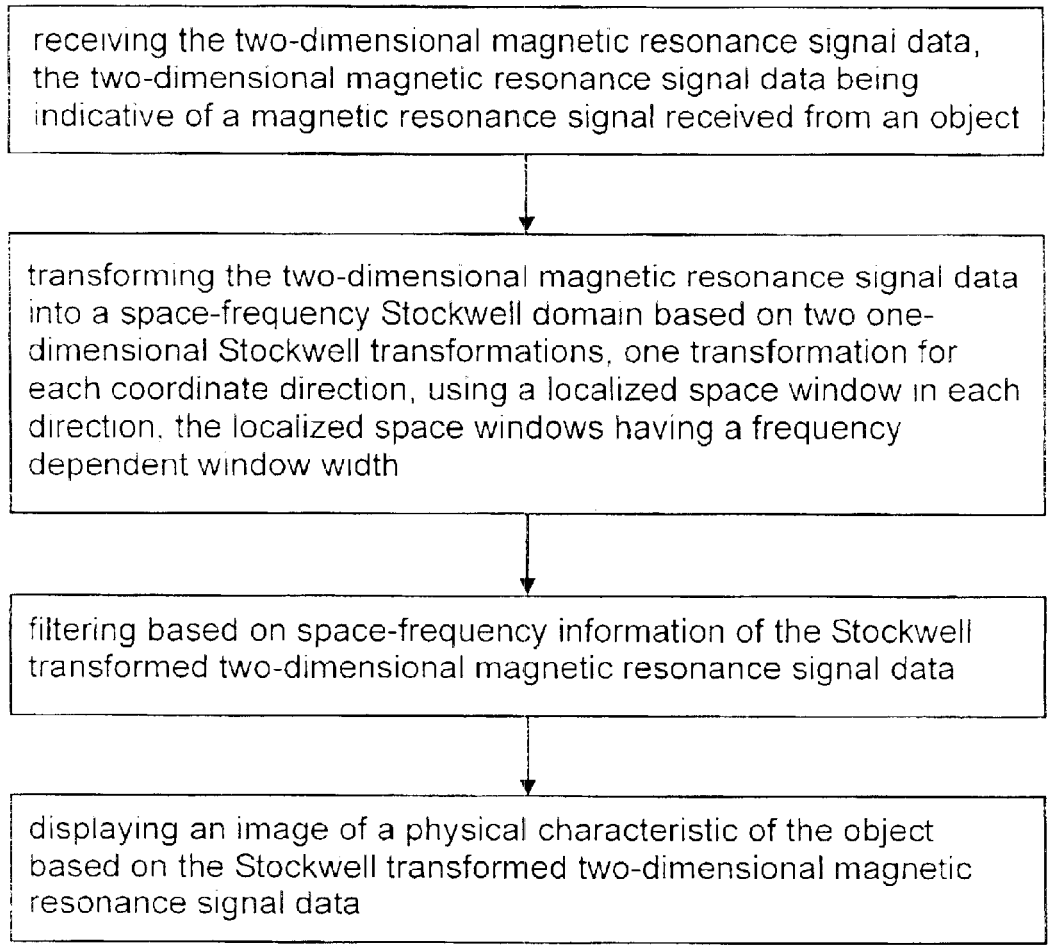

Extension of the one-dimensional ST to two or higher dimensions is straightforward in analogy to the multi-dimensional FT. For example, the two-dimensional (2D) ST for an image I(x,y) is simply two ID STs, one along a first axis—x—and the other along a second otrthogonal axis—y:

$$S(x',y',k_x,k_y)=F_y\{W_S(k_y(y-y'))\cdot F_x\{I(x,y)\cdot W_S(k_x(x-x'))\}\} \quad [10]$$

where $F_x(F_y)$ denotes the Fourier operator along the x(y) axis. Temporal frequency v in the ID ST becomes spatial frequencies $k_x$ and $k_y$, and $W_S$ is the Stockwell window function as defined in equation [5]. FIGS. 7a to 7c illustrate schematically three embodiments of a method for processing two-dimensional magnetic resonance image signal data according to the invention. Though x and y are defined as orthogonal axes, with appropriate modification non-orthogonal 2D co-ordinate systems are also supportable.

The 2D ST of an image provides information on changes of the spatial frequencies over space. The convertibility between the Fourier and the Stockwell domains and the other properties of the 1D ST apply to the two-dimensional case as well. Hence, it is possible to transform MRI image data into the 2D ST domain, process and correct the image data in the Stockwell domain, and then convert the processed and corrected image data back into the Fourier domain for additional processing—for example using existing Fourier domain processing techniques—and final image reconstruction. However, visualization of the results of the 2D ST is more difficult because the 2D ST returns a complex function of four variables; two spatial variables, x' and y', and two spectral variables, $k_x$ and $k_y$. As a post-processing tool, the 2D ST provides local spectral frequency variations. One of its direct applications is in image texture analysis, where the texture is defined by spatial frequency. This has been successfully applied by the inventors with respect to magnetic resonance imaging of Multiple Sclerosis lesions.

Furthermore, it is possible to extend the method for processing magnetic resonance signal data according to the invention to three, four or even higher dimensional STs leading to many other medical applications. For example, a 3D ST allows analysis of volume texture changes in 3D magnetic resonance scans to segment abnormal tissues in 3D. Additionally, it is possible to follow local changes in lesions over time by analyzing a time series of patient images using a 3D or 4D Stockwell domain analysis. Further additionally, the ability to unfold time and spatial frequency information allows refining and improving the magnetic resonance data acquisition process.

The Stockwell transform overcomes many limitations of the Fourier, Gabor and Wavelet transforms. The method of processing magnetic resonance signals according to the invention using the ST as a signal processing tool not only extends the magnetic resonance formalism, but overcomes many limitations of the Fourier framework of existing magnetic resonance signal processing tools. It is highly advantageous by providing frequency and time/space information while keeping a close connection with the Fourier formalism, which allows implementation of the method according to the invention into existing Fourier-based signal processing tools presently available for MRI systems. Further, the ST is a useful tool in motion artifact suppression in magnetic resonance signals, texture analysis and disease specific tissue segmentation.

Numerous other embodiments of the invention will be apparent to persons skilled in the art without departing from the spirit and scope of the invention as defined in the appended claims.

What is claimed is:

1. A method for processing magnetic resonance signal data comprising:
   sensing a magnetic resonance signal received from an object and providing magnetic resonance signal data in dependence thereupon;
   transforming the magnetic resonance signal data into second magnetic resonance signal data within a Stockwell domain using frequency dependent scaling windows; and,
   processing the second magnetic resonance signal data within the Stockwell domain to extract features therefrom.

2. A method for processing magnetic resonance signal data as defined in claim 1 wherein transforming the magnetic resonance signal into a Stockwell domain comprises:
   transforming the received magnetic resonance signal data into Fourier domain; and,
   convoluting the Fourier transformed magnetic resonance signal data over frequency based on Fourier convolution.

3. A method for processing magnetic resonance signal data as defined in claim 2 wherein processing the Stockwell transformed magnetic resonance signal data includes filtering the Stockwell transformed magnetic resonance signal data in the Stockwell domain.

4. A method for processing magnetic resonance sign data as defined in claim 3 comprising transforming the processed magnetic resonance signal data into a Fourier domain.

5. A method for processing magnetic resonance signal data as defined in claim 3 wherein the sensed magnetic resonance signal is a magnetic resonance signal time series and wherein the magnetic resonance signal data are transformed into a time-frequency Stockwell domain using a localizing time window having a frequency dependent window width in order to provide multi-resolution in the time-frequency domain.

6. A method for processing magnetic resonance signal data as defined claim 5 wherein the localized time window is determined such that a higher frequency resolution is obtained at low frequencies and a higher temporal resolution is obtained at higher frequencies.

7. A method for processing magnetic resonance signal data as defined in claim 6 wherein the localizing time window is based on a Gaussian function.

8. A method for processing magnetic resonance signal data as defined in claim 7 wherein the localizing time window is scaled.

9. A method for processing magnetic resonance si data as defined in claim 8 wherein processing the Stockwell transformed magnetic resonance signal data includes identifying temporal locations of frequency events.

10. A method for processing magnetic resonance signal data as defined in claim 9 comprising:
    determining regions in the time-frequency Stockwell domain containing frequency components associated with signal disturbances; and,
    zero-filling the determined regions in the time-frequency Stockwell domain.

11. A method for processing magnetic resonance signal data defined in claim 10 wherein the signal disturbances are associated with motion artifacts.

12. A method for processing magnetic resonance signal data as defined in claim 10 comprising transforming the processed magnetic resonance signs data into Fourier domain by summing the Stockwell transformed magnetic resonance signal data over time indices of the Stockwell domain.

13. A method for processing magnetic resonance sign data comprising:
    receiving the magnetic resonance signal data, the magnetic resonance signal data being indicative of a magnetic resonance signal received from an object;
    transforming the magnetic resonance signal data into second magnetic resonance signal data within a Stockwell domain using frequency dependent scaling windows; and,
    processing the second magnetic resonance signal data within the Stockwell domain to extract features relating to a physical occurrence within the object therefrom.

14. A method for processing magnetic resonance signal data as defined in claim 13 comprising analyzing the second magnetic resonance signal data within the Stockwell domain in order to determine a physical characteristic of the object.

15. A method for processing magnetic resonance signal data defined in claim 14 wherein the received magnetic resonance signal data are Fourier transformed magnetic resonance signal data and wherein the received Fourier transformed in magnetic resonance signal data are transformed into the Stockwell domain by convolution over frequency based on Fourier convolution.

16. A method for processing magnetic resonance signal data as defined in claim 14 comprising filtering the second magnetic resonance signal data in the Stockwell domain.

17. A method for processing magnetic resonance sign data as defined in claim 16 wherein filtering includes removing signal disturbances associated with motion artefacts.

18. A method for processing time varying signal data comprising:
   receiving the time varying signal data, the time varying signal data being indicative of a physical characteristic sensed from an object;
   transforming the time varying signal data into second signal data within a Stockwell domain using frequency dependent scaling windows; and,
   displaying an image of the physical characteristic of the object based on the second signal data.

19. A method for processing time varying signal data comprising:
   sensing a time varying signal indicative of a physical characteristic of an object;
   receiving time varying signal data in dependence upon the sensed time varying signal;
   transforming the time varying signal data into second signal data within a Stockwell domain using frequency dependent scaling windows to determine transformed time varying signal data.

20. A method according to claim 19 wherein the time varying signal comprises a signal relating to music, and comprising:
   filtering one of the transformed time varying signal and the time varying signal.

21. A method according to claim 19 wherein the time varying signal comprises time varying seismic data, and comprising:
   filtering one of the transformed time varying signal and the time varying signal.

22. A method according to claim 19 wherein the time varying signal comprises time varying voice data, and comprising:
   filtering one of the transformed time varying signal and the time varying signal.

23. A method according to claim 19 wherein the time varying signal comprises-environmental data, and comprising:
   filtering one of the transformed time varying signal and the time varying signal.

24. A method according to claim 19 wherein the time varying signal comprises video data, and comprising:
   filtering one of the transformed time varying signal and the time varying signal.

25. A method according to claim 19 wherein the time varying signal comprises sensor data for analysis, and comprising:
   generating a feedback control signal in dependence upon the transformed time varying signal data.

26. A method according to claim 19 wherein the time varying signal comprises a signal relating to music, and comprising:
   extracting data from one of the transformed time varying signal and the time varying signal.

27. A method according to claim 19 wherein the time varying signal comprises lime varying seismic data, and comprising:
   extracting data from one of the transformed time varying signal and the time varying signal.

28. A method according to claim 19 wherein the time varying signal comprises time varying voice data, and comprising:
   extracting data from one of the transformed time varying signal and the time varying signal.

29. A method according to claim 19 wherein the time varying signal comprises environmental data, and comprising:
   extracting data from one of the transformed time varying signal and the time varying signal.

30. A method according to claim 19 wherein die time varying signal comprises video data, and comprising:
   extracting data from one of the transformed time varying signal and the time varying signal.

31. A method for processing magnetic resonance signal data comprising:
   receiving the magnetic resonance signal data, the magnetic resonance signal data being indicative of a magnetic resonance signal received from an object;
   transforming the magnetic resonance signal data into second magnetic resonance signal data within a Stockwell domain using frequency dependent scaling windows; and,
   displaying an image of a physical characteristic of the object based on the second magnetic resonance signal data.

32. A method for processing magnetic resonance signal data defined in claim 31 wherein the received magnetic resonance signal data are two-dimensional magnetic resonance signal data and wherein the two-dimensional magnetic resonance signal data are transformed into a space-frequency Stockwell domain based on two one-dimensional Stockwell transformations, one transformation for each coordinate direction, using a localized space window in each direction, the localized space windows having frequency dependent window width.

33. A method for processing magnetic resonance signal data as defined in claim 32 comprising filtering the Stockwell transformed two-dimensional magnetic resonance image signal data in the space-frequency Stockwell domain.

34. A method for processing magnetic resonance signal data as defined in claim 33 comprising transforming the Stockwell transformed two-dimensional magnetic resonance signal data into Fourier domain by summing the Stockwell transformed two-dimensional magnetic resonance signal data over space indices of the Stockwell domain.

35. A method for processing magnetic resonance signal data as defined in claim 34 comprising image reconstruction in the Fourier domain.

36. A method for processing magnetic resonance signal data as defined in claim 32 comprising analyzing the Stockwell transformed two-dimensional magnetic resonance signal data in order to detect changes of spatial frequencies over space.

37. A method for processing magnetic resonance signal data as defined in claim 36 wherein the Stockwell transformed two-dimensional magnetic resonance signal data are analyzed for image texture analysis.

38. A method for processing multi-dimensional imaging signal data comprising:
   receiving the multi-dimensional imaging signal data, the multi-dimensional imaging signal data being indicative of a physical characteristic sensed from a patient;
   transforming the multi-dimensional imaging signal data into second multi-dimensional imaging signal data within a Stockwell domain using frequency dependent scaling windows; and,
   displaying an image of the physical characteristic of the patient based on the second multi-dimensional imaging signal data.

* * * * *